(12) United States Patent
Chan et al.

(10) Patent No.: US 9,344,808 B2
(45) Date of Patent: May 17, 2016

(54) DIFFERENTIAL SENSING ACOUSTIC SENSOR

(71) Applicant: InvenSense, Inc., San Jose, CA (US)

(72) Inventors: Mei-Lin Chan, Sunnyvale, CA (US); Michael Julian Daneman, Campbell, CA (US); Erhan Polatkan Ata, Santa Clara, CA (US); Xiang Li, Mountain View, CA (US); Martin Lim, San Mateo, CA (US)

(73) Assignee: INVENSENSE, INC., San Jose, CA (US)

( * ) Notice: Subject to any disclaimer, the term of this patent is extended or adjusted under 35 U.S.C. 154(b) by 108 days.

(21) Appl. No.: 14/218,561

(22) Filed: Mar. 18, 2014

(65) Prior Publication Data

US 2015/0266723 A1 Sep. 24, 2015

(51) Int. Cl.
| | | |
|---|---|---|
| H04R 19/04 | (2006.01) | |
| H04R 1/08 | (2006.01) | |
| H04R 31/00 | (2006.01) | |
| B81C 1/00 | (2006.01) | |
| H04R 19/00 | (2006.01) | |

(52) U.S. Cl.
CPC ............. *H04R 19/04* (2013.01); *B81C 1/00238* (2013.01); *H04R 1/08* (2013.01); *H04R 19/005* (2013.01); *H04R 31/003* (2013.01); *H04R 31/006* (2013.01); *B81B 2201/0257* (2013.01); *B81B 2207/012* (2013.01); *B81C 2203/0792* (2013.01); *H04R 2201/003* (2013.01)

(58) Field of Classification Search
CPC .... H04R 19/00; H04R 19/005; H04R 19/016; H04R 19/04; H04R 2201/003; H04R 2201/029; H04R 31/00; H04R 31/003; H04R 31/006
See application file for complete search history.

(56) References Cited

U.S. PATENT DOCUMENTS

| | | | | | |
|---|---|---|---|---|---|
| 5,490,220 | A * | 2/1996 | Loeppert | ............... | B81B 3/0072 381/113 |
| 7,146,016 | B2 * | 12/2006 | Pedersen | ............... | B81B 3/0072 381/113 |
| 7,280,436 | B2 * | 10/2007 | Pedersen | ............... | H04R 31/006 367/178 |
| 7,536,769 | B2 * | 5/2009 | Pedersen | ............... | B81B 3/0072 156/89.11 |
| 7,805,821 | B2 * | 10/2010 | Suzuki | ................. | H04R 19/005 29/25.35 |
| 7,951,636 | B2 * | 5/2011 | Lee | ..................... | B81C 1/00182 257/254 |
| 8,045,734 | B2 * | 10/2011 | Zhe | ...................... | H04R 31/003 381/174 |
| 8,175,300 | B2 * | 5/2012 | Lee | ..................... | B81C 1/00182 381/175 |
| 8,368,153 | B2 * | 2/2013 | Huang | .................. | B81B 7/0061 257/414 |
| 8,590,136 | B2 * | 11/2013 | Yang | .................... | H04R 19/005 257/704 |
| 8,664,733 | B2 * | 3/2014 | Rombach | ............. | H04R 19/005 257/416 |
| 8,692,340 | B1 * | 4/2014 | Ata | ........................ | B81B 3/001 257/415 |

(Continued)

*Primary Examiner* — Curtis Kuntz
*Assistant Examiner* — Joshua Kaufman
(74) *Attorney, Agent, or Firm* — Amin, Turocy & Watson, LLP

(57) ABSTRACT

A MEMS device includes a first plate coupled to a second plate and a fixed third plate formed on a first substrate. The first and second plates are displaced in the presence of an acoustic pressure differential across the surfaces of the first plate. The MEMS device also includes a first electrode formed on the third plate and a second electrode formed on the second substrate. The first, second plate, and third plates are contained in an enclosure formed by a first and second substrates. The device includes an acoustic port to expose the first plate to the environment. The MEMS device also includes a first gap formed between the second and third plates and a second gap formed between the second plate and the second electrode. The displacement of the second plate causes the first gap to change inversely to the second gap.

30 Claims, 12 Drawing Sheets

(56) References Cited

U.S. PATENT DOCUMENTS

| | | | |
|---|---|---|---|
| 8,693,711 B2* | 4/2014 | Ho | H01G 5/011 381/174 |
| 8,860,154 B2* | 10/2014 | Wang | H04R 19/04 257/254 |
| 2003/0133588 A1* | 7/2003 | Pedersen | B81B 3/0072 381/423 |
| 2007/0201710 A1* | 8/2007 | Suzuki | B81B 3/0072 381/174 |
| 2008/0232615 A1* | 9/2008 | Song | H04R 19/005 381/174 |
| 2008/0304681 A1* | 12/2008 | Langlois | H04R 1/222 381/174 |
| 2009/0092273 A1* | 4/2009 | Zhe | H04R 19/04 381/361 |
| 2009/0208037 A1* | 8/2009 | Zhe | H04R 7/20 381/174 |
| 2010/0158279 A1* | 6/2010 | Conti | H04R 7/24 381/174 |
| 2010/0158280 A1* | 6/2010 | Coronato | H04R 19/005 381/174 |
| 2010/0164025 A1* | 7/2010 | Yang | H04R 19/005 257/416 |
| 2011/0075865 A1* | 3/2011 | Yang | H04R 19/005 381/174 |
| 2011/0104844 A1* | 5/2011 | Hsieh | B81C 1/00246 438/50 |
| 2011/0182450 A1* | 7/2011 | Chung | H04R 17/005 381/190 |
| 2011/0189804 A1* | 8/2011 | Huang | H01L 21/30 438/53 |
| 2011/0311081 A1* | 12/2011 | Kim | B81B 7/0016 381/174 |
| 2012/0082325 A1* | 4/2012 | Sakurauchi | B81C 1/00666 381/174 |
| 2012/0308066 A1* | 12/2012 | Chen | H04R 19/005 381/369 |
| 2013/0001710 A1* | 1/2013 | Daneman | H01L 23/10 257/415 |
| 2013/0028459 A1* | 1/2013 | Wang | H04R 19/04 381/369 |
| 2013/0044899 A1* | 2/2013 | Barber | H04R 19/016 381/113 |
| 2013/0161702 A1* | 6/2013 | Chen | B81C 1/00246 257/254 |
| 2013/0221457 A1* | 8/2013 | Conti | B81B 7/0061 257/416 |
| 2013/0294622 A1* | 11/2013 | Kasai | H04R 19/005 381/162 |
| 2014/0072150 A1* | 3/2014 | Liu | H04R 19/005 381/174 |
| 2014/0105428 A1* | 4/2014 | Zoellin | H04R 23/00 381/174 |
| 2014/0133685 A1* | 5/2014 | Liu | H04R 7/20 381/355 |
| 2014/0217522 A1* | 8/2014 | Wang | H04R 19/005 257/416 |
| 2014/0239352 A1* | 8/2014 | Wang | H04R 19/04 257/254 |
| 2015/0003638 A1* | 1/2015 | Kasai | H04R 1/08 381/122 |
| 2015/0035094 A1* | 2/2015 | Laermer | H04R 19/005 257/416 |
| 2015/0041930 A1* | 2/2015 | Kim | H04R 19/005 257/416 |
| 2015/0043759 A1* | 2/2015 | Koji | H04R 31/00 381/175 |
| 2015/0078591 A1* | 3/2015 | Kasai | H04R 19/04 381/191 |
| 2015/0078592 A1* | 3/2015 | Uchida | H04R 19/005 381/191 |
| 2015/0104048 A1* | 4/2015 | Uchida | H04R 7/06 381/174 |
| 2015/0110309 A1* | 4/2015 | Park | H04R 19/005 381/190 |
| 2015/0125003 A1* | 5/2015 | Wiesbauer | B81B 3/0021 381/111 |
| 2015/0129992 A1* | 5/2015 | Hur | B81B 3/0086 257/416 |
| 2015/0156576 A1* | 6/2015 | Uchida | H04R 7/06 381/174 |
| 2015/0158722 A1* | 6/2015 | Lim | B81B 3/001 257/416 |

\* cited by examiner

DIFFERENTIAL SENSING ACOUSTIC SENSOR

FIELD OF THE INVENTION

The present invention relates to generally to Micro-Electro-Mechanical Systems (MEMS) devices, and more particularly, to a differential MEMS acoustic sensor.

BACKGROUND

Most commercially available MEMS acoustic sensors or microphones are formed by two chips, an application specific integrated circuit (ASIC) chip and a MEMS chip attached to a substrate. These chips are conventionally enclosed by a conductive cover or lid. An acoustic input can be provided from an opening on a top surface of the acoustic sensor or from an opening on the substrate. Typically, in commercial applications where the acoustic input is from the top, an acoustic back cavity is formed mainly by a volume under the MEMS chip and the substrate. By contrast, in commercial applications where the acoustic input is from the bottom, the acoustic cavity is typically formed by the volume enclosed by the substrate and the cover.

The performance of a conventional acoustic sensor is dependent on having an adequate area for both acoustic sensing and electrical transduction; however the cost and functionality of the microphone puts a limit on the package size. These two sets of opposing and competing requirements often require some form of compromise.

It is desirable to provide improvements to MEMS acoustic sensors which allow the sensors to be more easily manufactured at a lower cost and have improved performance. The improved MEMS acoustic sensor must be easily implemented, cost effective and adaptable to existing manufacturing processes.

The present invention addresses such a need.

SUMMARY

MEMS devices are disclosed. In a first aspect, a MEMS device includes a first plate with a first surface and a second surface and a second plate with a third surface and a fourth surface. The second plate is mechanically and electrically attached to the first plate. The MEMS device further includes a third fixed plate with a fifth surface and a sixth surface; structurally attached but electrically isolated from the first and second plates. The first, second and third plates are all formed on the first substrate, and bonded to a second substrate.

The MEMS device further includes a linkage connecting the first plate to the second plate. The MEMS device includes a suspension that connects the first plate and second plate to an anchor on the first substrate. The first plate and second plate are displaced in the presence of an acoustic pressure differential between the first and second surfaces. In addition, the MEMS device includes a first electrode formed on the third plate in the first substrate and a second electrode formed on the second substrate. The first plate, the second plate, the third plate, linkage, and suspension are contained in an enclosure formed by a first substrate and a second substrate.

One of the first and second substrates and the third plate contains an acoustic port to expose the first plate to the environment. The MEMS device also includes a first gap formed between the second plate and the third plate. Finally, the MEMS device includes a second gap formed between the second plate and the second electrode. The displacement of the second plate causes the first and second gap to change inversely.

In a second aspect, an acoustic sensing device is disclosed. The acoustic sensing device includes a structure with a first surface and a second surface attached to a first substrate. A first electrode is formed on the first substrate and a second electrode is formed by a conductive layer on a second substrate. The structure is suspended between first and second electrodes to provide a differential sensing scheme. The structure is displaced in the presence of an acoustic pressure differential between the first and second surfaces of the first plate.

In a third aspect, an integrated microphone is disclosed. The integrated microphone includes a microphone structure attached to a first substrate. The microphone structure is suspended between the first and second electrodes to provide a differential sensing scheme. One of the first electrode and second electrode is a deposited conductor on the substrate and the other of the first electrode and second electrode is a conductive back plate. Only one of the first or second substrates contains an opening to expose the structure to the environment.

BRIEF DESCRIPTION OF THE DRAWINGS

The accompanying figures illustrate several embodiments of the invention and, together with the description, serve to explain the principles of the invention. One of ordinary skill in the art readily recognizes that the particular embodiments illustrated in the figures are merely exemplary, and are not intended to limit the scope of the present invention.

DETAILED DESCRIPTION

Figure 1:
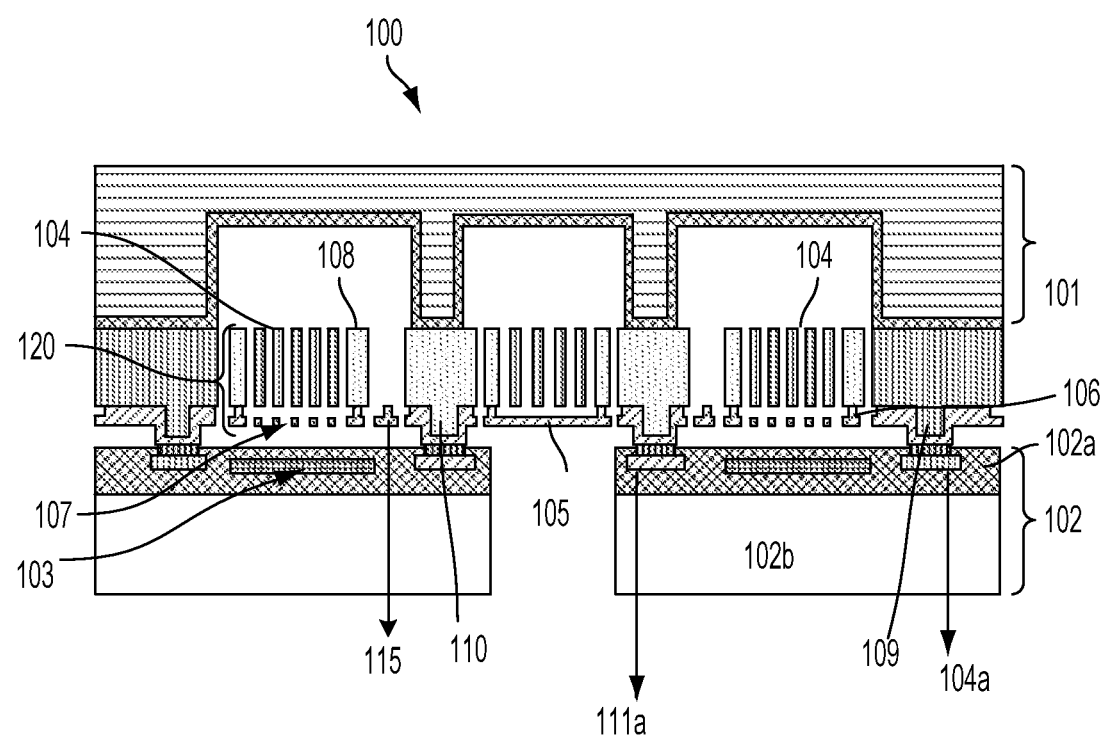
FIG. 1 illustrates a differential integrated acoustic sensor in accordance with the present invention.

The present invention relates generally to MEMS devices, and more particularly, to a MEMS acoustic sensor such as a microphone. The following description is presented to enable one of ordinary skill in the art to make and use the invention and is provided in the context of a patent application and its requirements. Various modifications to the described embodiments and the generic principles and features described herein will be readily apparent to those skilled in the art. Thus, the present invention is not intended to be limited to the embodiments shown but is to be accorded the widest scope consistent with the principles and features described herein.

In the described embodiments, Micro-Electro-Mechanical Systems (MEMS) refers to a class of structures or devices fabricated using semiconductor-like processes and exhibiting mechanical characteristics such as the ability to move or deform. MEMS devices often, but not always, interact with electrical signals. MEMS devices include but are not limited to gyroscopes, accelerometers, magnetometers, pressure sensors, microphones, and radio-frequency components. Silicon wafers containing MEMS structures are referred to as MEMS wafers.

In the described embodiments, MEMS device may refer to a semiconductor device implemented as a micro-electro-mechanical system. A MEMS device includes mechanical elements and optionally includes electronics for sensing. MEMS devices include but not limited to gyroscopes, accelerometers, magnetometers, microphones, and pressure sensors. MEMS structure may refer to any feature that may be part of a larger MEMS device. One or more MEMS features comprising moveable elements is a MEMS structure. A structural layer may refer to the silicon layer with moveable structures. MEMS substrate provides mechanical support for the MEMS structure. The MEMS structural layer is attached to the MEMS substrate. The MEMS substrate is also referred to as handle substrate or handle wafer. In some embodiments, the handle substrate serves as a cap to the MEMS structure. A cap or a cover provides mechanical protection to the structural layer and optionally forms a portion of the enclosure. Standoff defines the vertical clearance between the structural layer and the IC substrate. Standoff may also provide electrical contact between the structural layer and the IC substrate. Optionally, standoff may also provide a seal that defines an enclosure. Integrated Circuit (IC) substrate may refer to a silicon substrate with electrical circuits, typically CMOS circuits. A cavity may refer to a recess in a substrate. An enclosure may refer to a fully enclosed volume typically surrounding the MEMS structure and typically formed by the IC substrate, structural layer. MEMS substrate, and the standoff seal ring. An external enclosure may refer to an external package, cover or lid that encloses the microphone. A port may be an opening through a substrate to expose the MEMS structure to the surrounding environment. Bonding may refer to methods of attaching. The MEMS substrate and the IC substrate may be bonded using eutectic bond (AlGe, CuSn, AuSi), fusion bond, compression, thermocompression, adhesive bond i.e. glue, solder, anodic bonding, glass frit. An Engineered silicon-on-insulator (ESOI) wafer may refer to a SOI wafer with cavities underneath the device wafer. Chip includes at least one substrate typically formed from a semiconductor material. A single chip may be formed from multiple substrates, where the substrates are mechanically bonded to preserve the functionality. Multiple chip includes at least two substrates, wherein the two substrates are electrically connected, but do not require mechanical bonding. Typically, multiple chips are formed by dicing wafers. A package provides electrical connection between the bond pads on the chip to a metal lead that can be soldered to a printed circuit board (PCB). A package typically comprises a substrate and a cover.

In the described embodiments, a back cavity may refer to a partially enclosed cavity equalized to ambient pressure via pressure equalization channels (PEC). In some embodiments, a back cavity is also referred to as a back chamber. A back cavity formed within the CMOS-MEMS device can be referred to as an integrated back cavity. A back cavity that is formed between the CMOS-MEMS device and the package can be referred to as an external or open back cavity. Pressure equalization channels, also referred to as venting or leakage channels/paths, are acoustic channels for low frequency or static pressure equalization of a back cavity to ambient pressure.

In the described embodiments, a rigid structure within a MEMS device that moves when subject to force may be referred to as a plate. Although rigid plates are preferred for the described embodiments, semi rigid plates or deformable membranes could replace rigid plates. Plates may comprise of silicon, silicon containing materials (e.g. poly-silicon, silicon oxide, silicon nitride), metals and materials that are used in semiconductor processes (e.g. aluminum nitride, germanium). A back plate may be a solid or perforated plate comprising at least one electrode. The electrode can be comprised of semiconductor process compatible conductive materials (e.g. poly-silicon, silicon, aluminum, copper, nickel, titanium, chromium, gold). The electrodes may have insulating films on one or more surfaces.

In the described embodiments, perforations refer to acoustic openings for reducing air damping in moving plates. An acoustic port may be an opening for sensing the acoustic pressure. An acoustic barrier may be a structure that prevents acoustic pressure from reaching certain portions of the device. Suspension is a structure that provides electrical conductivity and compliant attachment from the MEMS structure to a substrate through anchors. Suspension can further include a plurality of flexures and hinges configured to connect the anchor to the MEMS structures. Linkage is a structure that provides electrical conductivity and mechanical attachment between plates. Linkages that couples between plates can also include a plurality of flexure and hinges. Extended acoustic gap can be created by step etching of the post and creating a partial post overlap over the PEC. In-plane bump stops limit range of movement in the plane of the plate if the plates move more than desired (e.g. under a mechanical shock). Similarly rotational bump stop are extensions of the plate to limit the displacement normal to the plane due to out-of-plane rotation.

In the described embodiments, structures (plates) of MEMS device and electrodes formed on CMOS substrate form sensor capacitors. Sensor capacitors are electrically biased for detection of change of capacitance due to acoustic pressure.

To describe the features of the present invention in more detail, refer now to the following description in conjunction with the accompanying figures.

FIG. 1 illustrates an integrated acoustic sensor 100 in accordance with the present invention. The integrated acoustic sensor includes a first substrate 101, microphone structure 120, standoffs 109 and 110, and a second substrate 102. In an embodiment, the first substrate 101 is a MEMS substrate comprising a cap and the second substrate 102 comprises a base layer for Integrated Circuit (IC) 102b and a dielectric layer 102a. The second substrate 102 can be referred as the CMOS substrate of IC substrate. The microphone sensor structure 120 includes a sensor membrane and thick reinforcements 108. The sensor membrane includes a piston portion of the membrane 105, a perforated membrane 107 and a thicker portion of the membrane 106. The motion of a portion of microphone structure 120 is sensed by a back plate 104 which functions as a first sense electrode and a second electrode 103 in the second substrate 102. Pad 104a connects the back plate 104 to the IC substrate 102 via standoff 109. Pad 111a connects the sensor membrane to the IC substrate 102. An impact on sense area reduction of the acoustic sensor 100 due to port opening over piston area is mitigated by the additional sensing area provided by back plate 104. In so doing, when the acoustic sensor 100 is fully integrated, a sandwich stack of a first electrode/back plate 104, microphone sensor structure 120, and a second sense electrode 103 form an electrode-membrane-electrode structure.

In an embodiment, the back plate 104 increases the area of electrical transduction. The differential transduction mechanism as compared to a single electrode opens up additional capabilities to control the acoustic sensor 100. In an embodiment, the back plate 104 is typically rigid in comparison to the membrane. The back plate is fixed and insensitive to acoustic input. The back plate can be designed to reduce damping by accommodating perforations, slots and spacing without compromising the rigidity of the back plate. The following description discusses the features of the present invention in more detail.

As shown in FIG. 1, the integrated differential acoustic sensor 100 includes one or more structural layers 120 suspended over two or more electrodes on the top and bottom to form two variable capacitors to form a differential sensing cell. The acoustic sensor 100 can be formed for example by a material deposition and etching on a first substrate 101 and subsequently bonded to a second substrate 102. The differential scheme is formed by suspending a microphone plate 120 between the two sense electrodes 103 and 104. On the IC substrate the differential scheme is formed by pads 111a, 103 and 104a. The first sense electrode is the conductive back plate 104; while the second sense electrode 103 on the substrate 102 is buried under a stack of dielectric material 102a. The differential scheme allows for two variable capacitances to be set across the membrane as the gaps between the microphone plate 120 and the two sense electrodes 103 and 104. The gaps and consequentially the capacitances change with acoustic excitation.

Under the effect of an acoustic excitation for example in the z-axis (orthogonal to the plate), the acoustic plate 105 senses the acoustic pressure and responds by translating the acoustic pressure to a linear displacement along the direction parallel to the acoustic excitation. The perforated membrane 107 has substantially the same mechanical displacement, changing the relative size of the two mechanical gaps formed between the perforated membrane 107 and the first sense electrode 104 and the second sense electrode 103. As the perforated membrane 107 is displaced, one of the two mechanical gaps is increased whereas the other of the two mechanical gaps is decreased. The corresponding capacitance changes are opposite and are the basis of the differential sensing scheme.

Figure 5A:
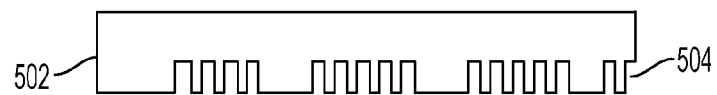
FIGS. 5A-5V' are diagrams that illustrate an embodiment of process steps to form a differential MEMS microphone.
Figure 5B:
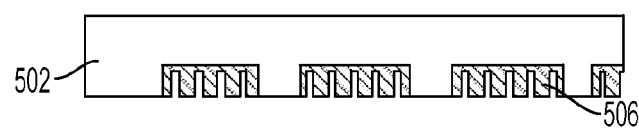
Figure 5C:
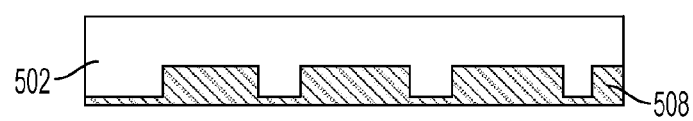
Figure 5D:
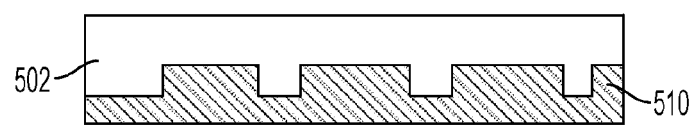
Figure 5E:
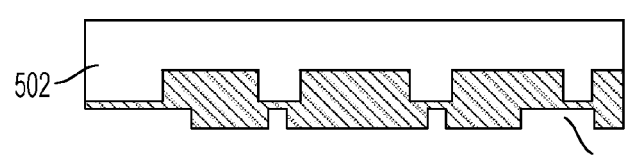
Figure 5F:
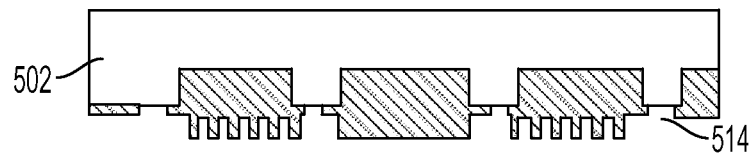
Figure 5G:
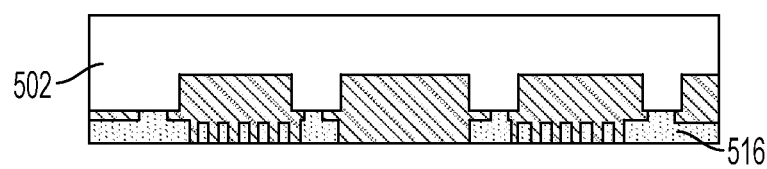
Figure 5H:
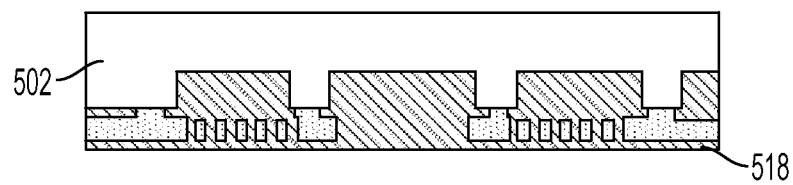

Gap between the sensor membrane and the second sense electrode 103 is largely defined by the thickness of the standoff 109 and 110, while gap between the sensor membrane and the back plate 104 is defined by sacrificial oxide layer thickness as described in process step FIG. 5H.

Figure 1A:
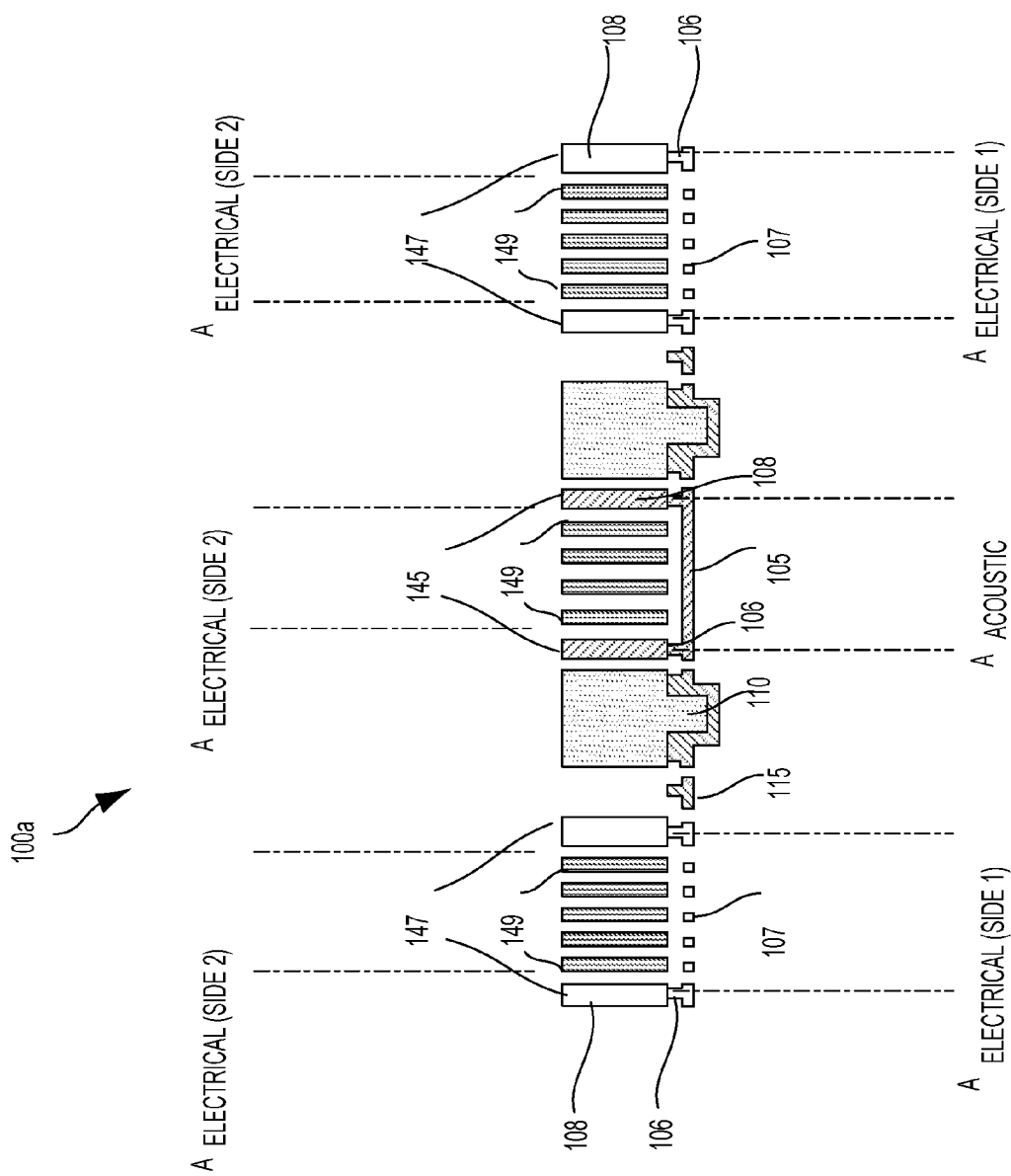
FIG. 1A illustrates a structural layer of the acoustic sensor.

FIG. 1A illustrates a schematic cross-section of one embodiment of the structural layer of the integrated differential MEMS microphone. In this embodiment, the first plate 145 is defined as the microphone plate or piston that is positioned right over the acoustic port. The area of this plate facing the port defines the acoustic area, $A_{acoustic}$ that is directly used to detect the pressure differential across the top and bottom surfaces of the plate. The second plate 147 is perforated and connected to the first plate through linkage 115. The first plate 145 consists of a thin membrane 105, thick portion 106, and thick reinforcement ribs 108. The second plate, 147 consists of perforated thin membrane 107, thick portion 106, and thick reinforcement ribs 108. The third plate 149 (also depicted as the back plate 104) acts as the conductive first sense electrode that detects the motion of the second plate. The second plate 147 is suspended between the third plate 149 and the second sense electrode on the IC substrate and separated by two inversely related gaps. The overlapping area between the second plate and the second sense electrode defines the first set of electrical sensing area $A_{electrical\ (side1)}$; while the overlapping area between the second plate and the third plate defines the second set of electrical sensing area $A_{electrical\ (side2)}$. As the first plate moves with the acoustic input towards the third plate, the second plate follows the motion and reduces the gap between the second and third plate, increasing the capacitance between these two plates. At the same time, the gap between the second plate and the second electrode on the IC substrate increases, decreasing the capacitance between the two structures. This effectively increases the area that can be used for translating the motion of the acoustic sensor to electrical output signals.

Figure 1B:
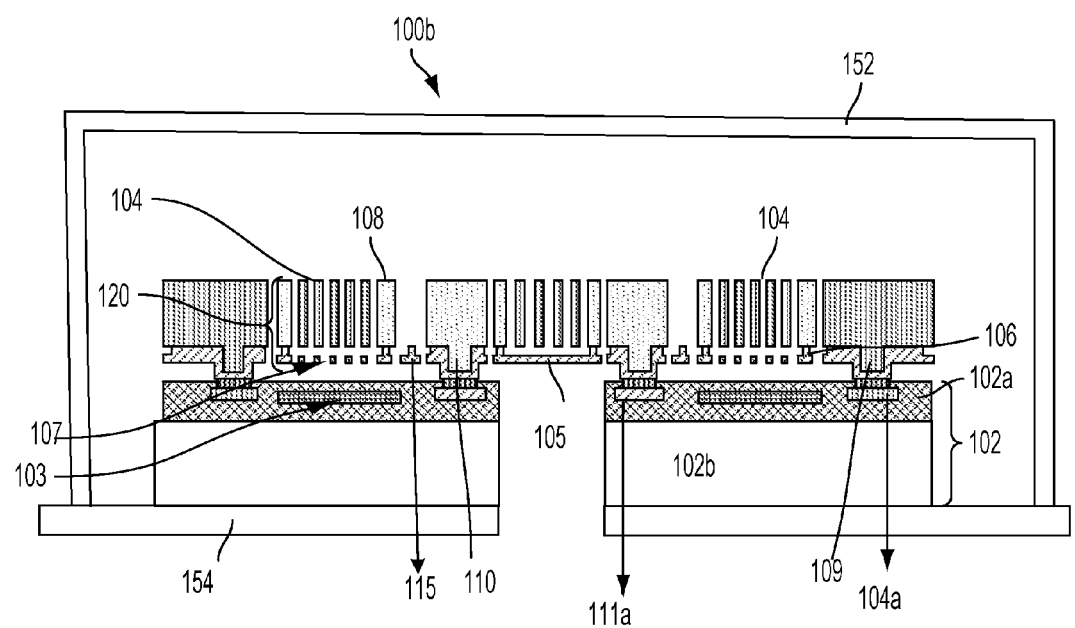
FIG. 1B illustrates a differential integrated acoustic sensor with external/open back cavity to the package in accordance with the present invention.

FIG. 1B illustrates an integrated acoustic sensor 100b with external back cavity. In this embodiment, the back cavity volume is provided by an enclosure formed by lid 152 and laminate 154. Laminate 154 is also known as the package substrate.

Figure 2A:
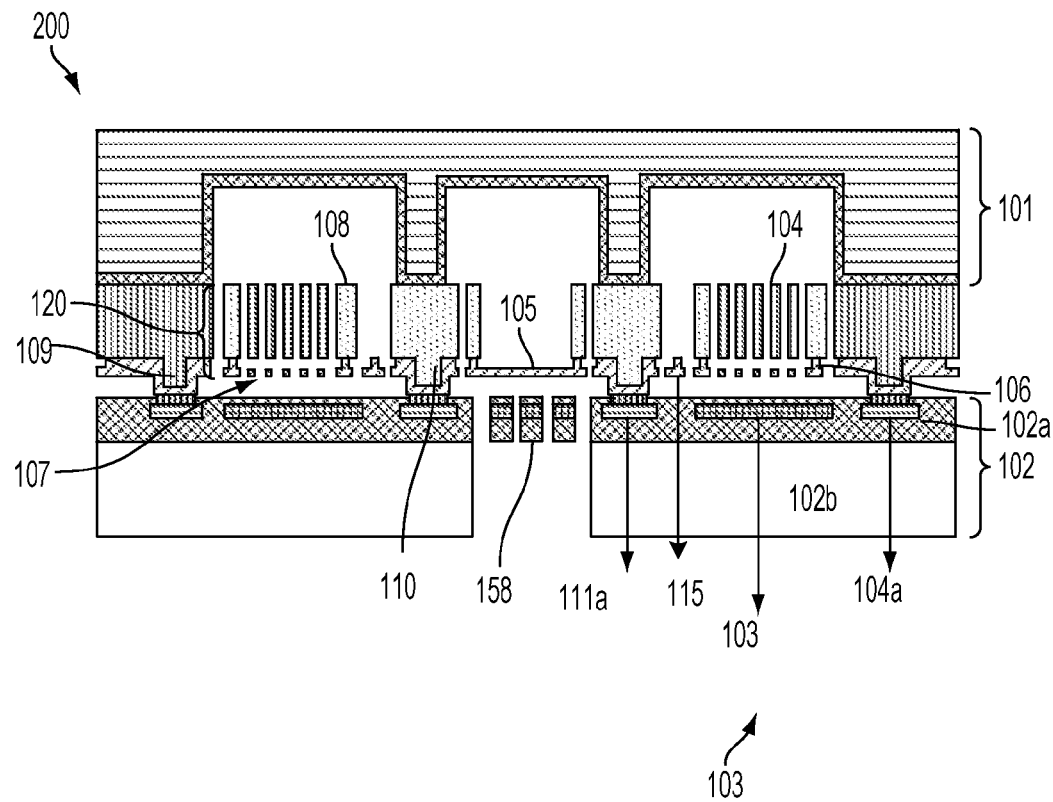
FIG. 2A illustrates a schematic cross-section of one embodiment of the integrated differential MEMS microphone structure of FIG. 1.

FIG. 2A illustrates a schematic cross-section of one embodiment of the integrated differential MEMS microphone structure where a portion of the back plate 104 over the piston portion 105 of the membrane is not present. Some embodiments may include a perforated plate 158 covering a portion of the acoustic port and formed on the second substrate 102. The perforated plate 158 includes electrodes to increase the sensing area.

The microphone structure 120 comprises of the two structural layers: the thinner sensor membrane (typically a thin layer in the range of ~1 um) stretched across the thicker reinforcement ribs 108 (typically a layer thicker than the thin membrane layer). The reinforcement ribs 108 are also referred to as frame layer. The presence of the reinforcement ribs helps to improve the rigidity of the microphone structure. These two structural layers can be made from the same or different structural materials. The materials are typically conductive and for example could be polysilicon or single crystal silicon.

The thinner sensor membrane includes a piston portion of the membrane 105, a perforated membrane 107 and a thicker portion of the membrane 106. The connection between the piston membrane and perforated membrane is carried out through linkage 115, which can be designed using the thin, the thick structural layer or a combination of both, depending on the compliance of the linkage required.

The first plate can be rigidly coupled to the second plate through stiff linkage such that the first and second plates move substantially together parallel to the input acoustic pressure. In another embodiment, the linkage between the first plate and the second plate can be configured to be highly compliant to amplify a substantially small displacement in the first plate into a substantially larger displacement in the second plate. In alternative embodiments, the linkage coupling the first plate to the second plate can also be configured as torsional flexures such that motion excited by the acoustic input in the first plate will result in out of phase motion in the second plate.

The back plate 104 is perforated to reduce air damping as the perforated membrane 107 moves between the back plate 104 and the second sense electrode 103 on the IC substrate. The back plate 104 in an embodiment can have the same or different perforation shape, size and pattern as the perforated membrane 107. The perforated membrane 107 is electrically connected to pad 111a on the second substrate 102 through a standoff 110; while the back plate 104 is electrically connected to the pad 104a on the second substrate 102 through the standoff 109. Both pads 111a and 104a are electrically isolated from the second sense electrode 103.

Figure 2B:
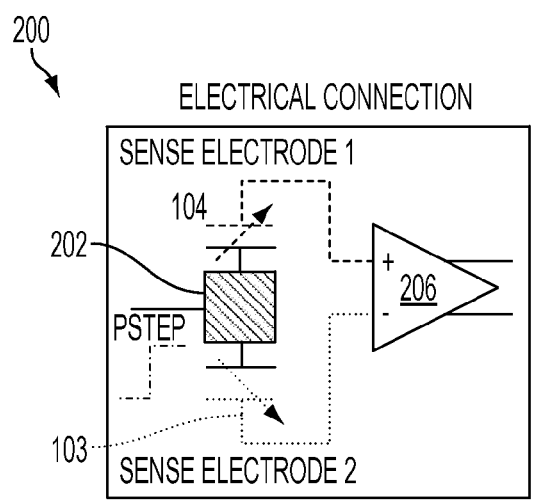
FIG. 2B illustrates a differential sensing circuit of two electrodes as acoustic pressure excitation is applied on a plate of FIG. 1.

FIG. 2B illustrates a differential sensing circuit 200 of two electrodes as acoustic pressure excitation is applied on the first plate of FIG. 2A. The differential sensing circuit 200 includes the acoustic sensor 100 coupled to a charge pump/voltage source 202 and the first sense electrode/back plate 104 and the second sense electrode 103 are coupled to the two inputs of a differential amplifier 206 to remove common mode signals. The output from the differential amplifier 206 is directly proportional to the differential capacitance created by the displacement of the sensor membrane.

Figure 3:
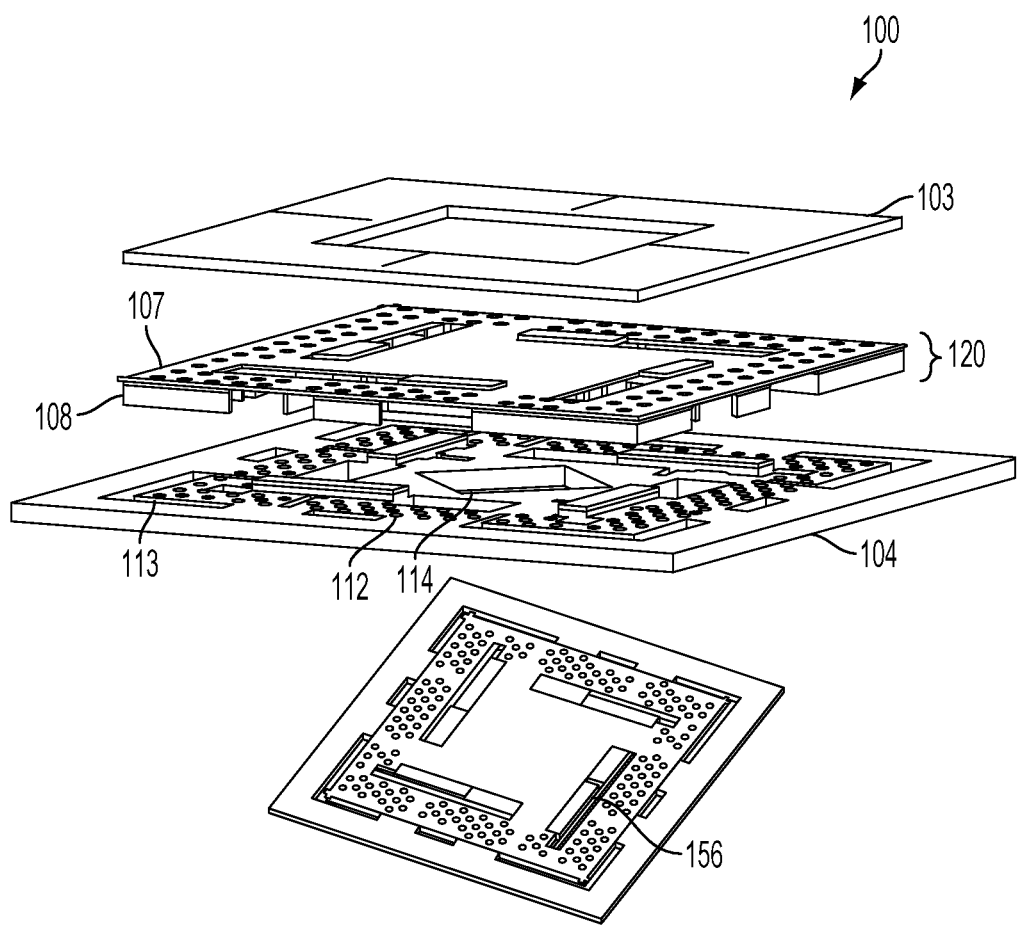
FIG. 3 illustrates an exploded view of the layers forming the differential acoustic sensor of FIG. 1.

FIG. 3 illustrates an exploded view of the layers forming the differential acoustic sensor of FIG. 1. The differential acoustic sensor comprises three functional layers: a first sense electrode/back plate 104, a perforated membrane 107, and a second sense electrode 103. The second sense electrode 103 can be a single electrode or divided into N sections (depicted as four quarters in this embodiment) to enable directional sensing to detect any spurious vibrational modes of the microphone structure (e.g. tip, tilt, etc.) as a result of fabrication variations or structural defects. This multi-electrode configuration can be employed as a means to evaluate the integrity of the acoustic sensor during test mode. In the microphone plate 120, two structural components of the acoustic sensor are shown here as a perforated membrane 107 and a structural rib 108. In some embodiments, structural rib 108 is also referred to as frame. In an embodiment, the perforated membrane 107 is made from polysilicon while the ribs are composed of single crystal silicon. Suspension 156 for anchoring the acoustic sensor can be constructed using either structural layer or the combination of both. The back plate 104 includes perforations 112 for damping relief and slots 113 for the thick reinforcement rib 108 to travel along the z-direction. In this embodiment, the area of the back plate 104 immediately below the microphone plate 120 is cut out to reduce damping. In another embodiment, the back plate 104 can be a perforated plate.

Figure 4:
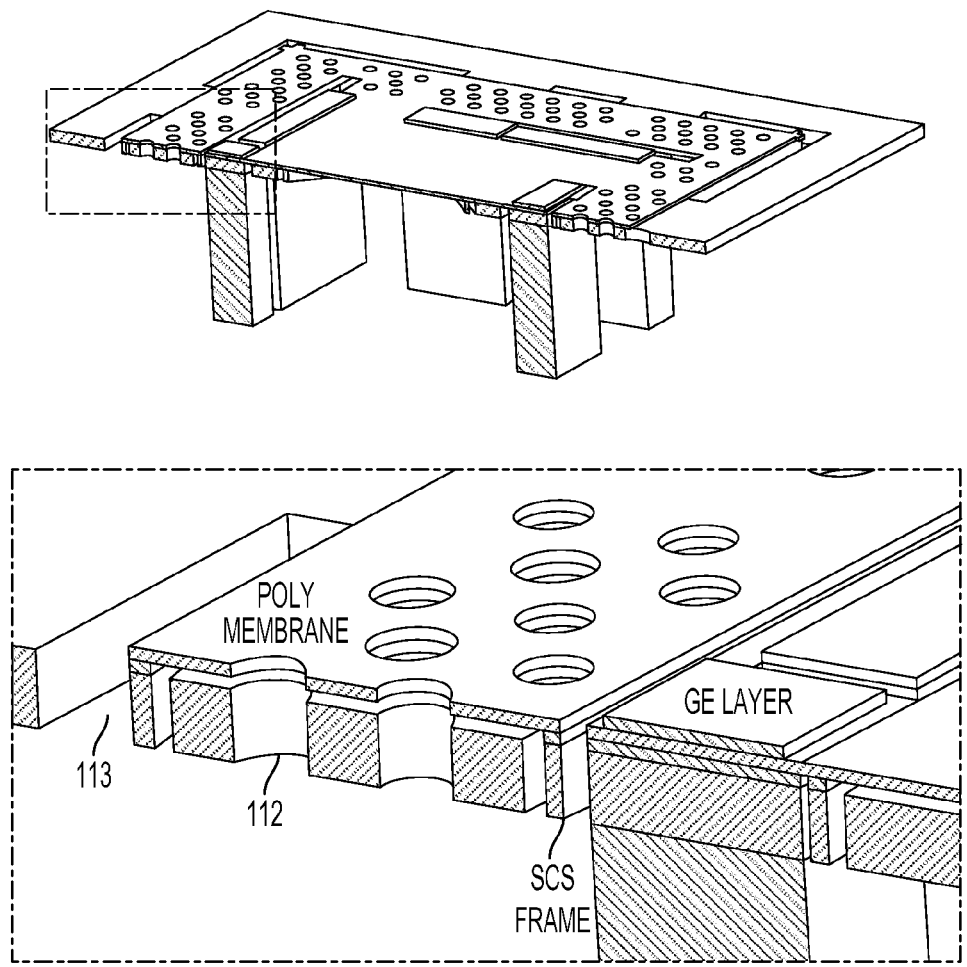
FIG. 4 illustrates an assembled view of the back plate and MEMS microphone layer of the acoustic sensor.

FIG. 4 depict 3D cross-section view of the differential acoustic sensor with the moving microphone layer 120 and back plate 104 assembled together. Slots 113 formed on the back plate 104 allows for the thick structural frame layer 108 to translate in the direction orthogonal to the back plate 104. The slots 113 increase the available fringe capacitance between the plate and the electrodes. In this embodiment, the back plate 104 is shown to have the same perforations 112 as the perforated membrane 107 for damping relief. In this embodiment of the invention, the thin membrane layer is made from polysilicon while the thicker reinforcement ribs are constructed through single crystal silicon (SCS) layer. In another embodiment the ribs can be made of polysilicon. In yet another embodiment the membrane can be constructed out of single crystal silicon or combinations of silicon nitride and polysilicon, or silicon nitride and single crystal silicon. The germanium layer deposited over the standoff facilitates the bonding between the IC substrate and the MEMS substrate using aluminum-germanium eutectic bonds or any other similar bonding methods.

Figure 5I:
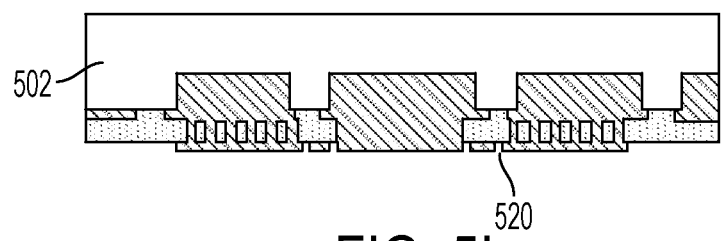
Figure 5J:
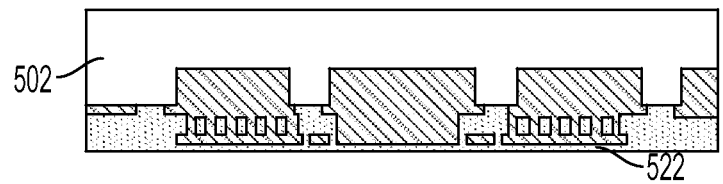
Figure 5K:
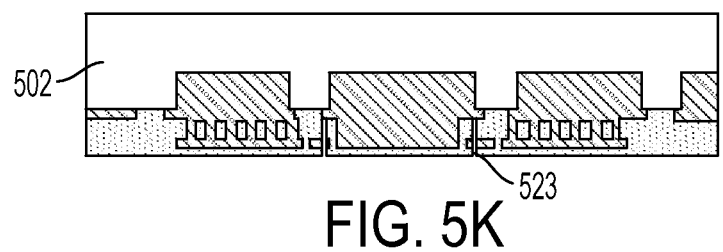
Figure 5L:
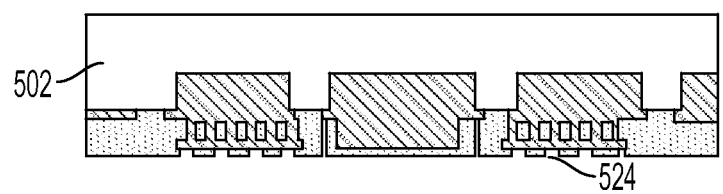
Figure 5M:
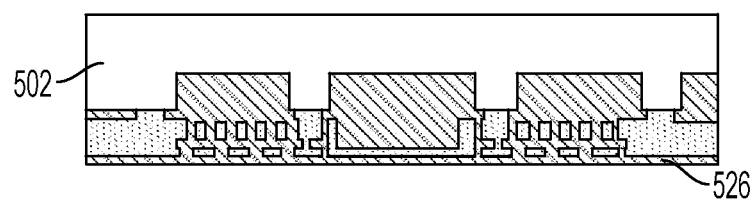
Figure 5N:
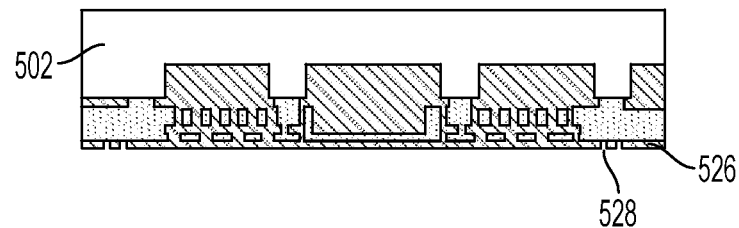
Figure 5O:
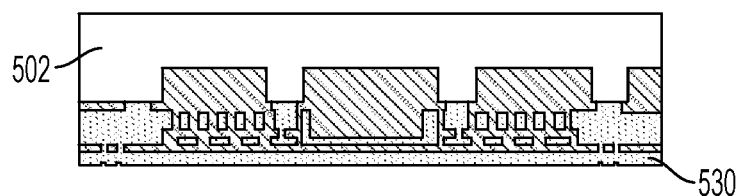
Figure 5P:
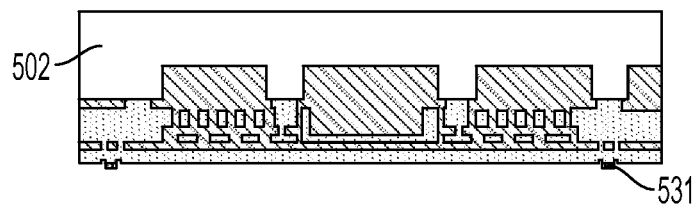
Figure 5Q:
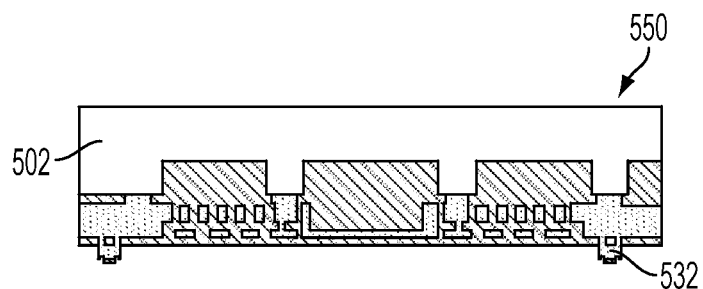
Figure 5R:
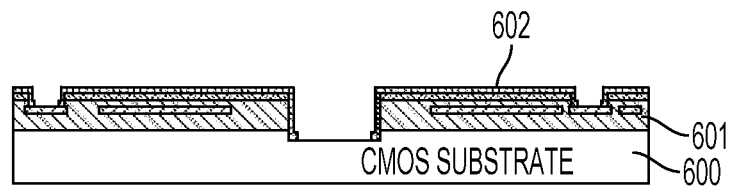
Figure 5S:
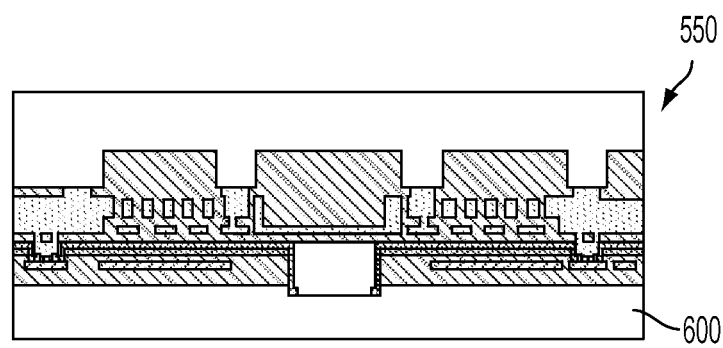
Figure 5T:
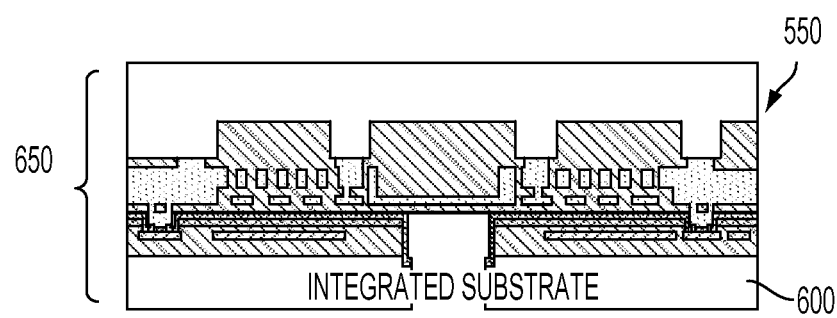
Figure 5U:
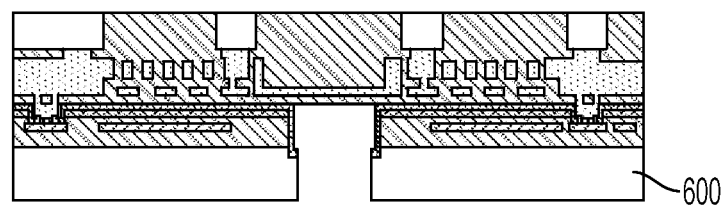
Figure 5V:
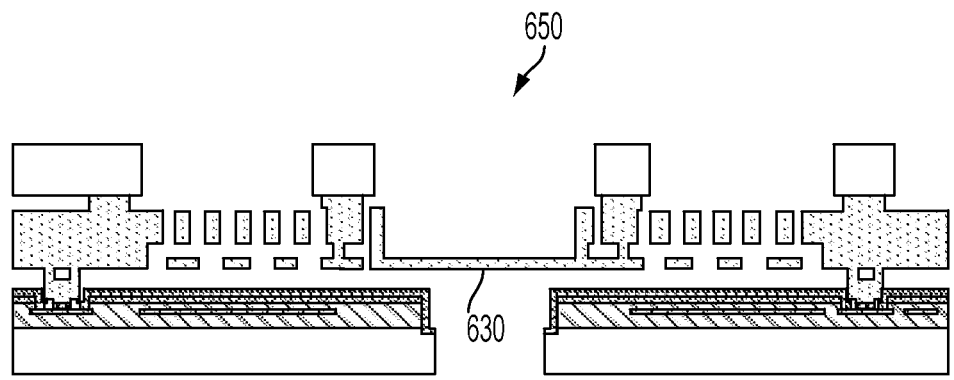
Figure 5V:
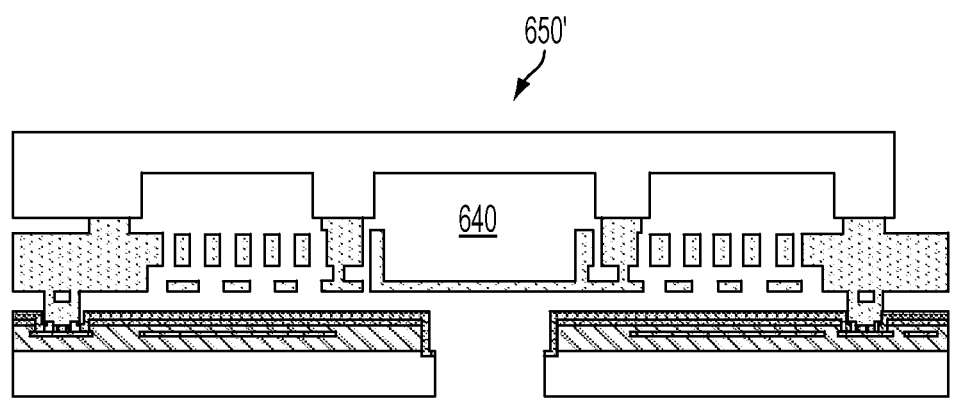

FIGS. 5A-5V' are diagrams that illustrate an embodiment of process steps to form a differential MEMS microphone. FIG. 5A illustrates a cap 502 that is used as the starting structural support layer to provide support to the acoustic sensor. Microstructure arrays 504 are first etched into the cap 502 to create features for lateral trench isolation.

Thereafter in FIG. 5B, the microstructure arrays 504 can be consumed in the oxidation process to form silicon oxide structures 506. The ratio between feature spacing and feature width determines the time required for the oxidation process to convert all silicon microstructures to oxide microstructures.

The gap between silicon oxide structures 506 can then be filled through conformal oxide deposition, where the high density plasma (HDP) oxide with thickness greater than the gap spacing is deposited to form an oxide block 508 to ensure that all gaps are completely filled as shown in FIG. 5C. Chemical-mechanical polishing (CMP) or other techniques may be used to planarize the surface to ensure flat surface for the subsequent structural layers deposition.

In FIG. 5D, a first sacrificial layer 510 made from an insulating material such as SiO2 is then deposited. The thickness of the layer 510 defines the thickness of the reinforcement ribs and the thickness of the back plate.

Thereafter, as shown in FIGS. 5E and 5F, features 512 and vias 514 are etched into sacrificial layer to form the mold to build the reinforcement ribs, thick anchor bases and the top back plate electrode. The mold is filled as shown in FIG. 5G using a deposition of a thick conductive structural layer (e.g. polysilicon) 516 and then planarized using CMP or equivalent method to expose the sacrificial mold layer. A second sacrificial oxide layer 518 is deposited as shown in FIG. 5H. The thickness of this sacrificial layer defines a structural gap between a microphone plate and the back plate. Vias 520 are then etched onto the second sacrificial oxide as shown in FIG. 5I, to form electrical contact points to the thick structural layer. A second thin conductive structural layer 522 which may or may not be of the same structural material (e.g. polysilicon) is then conformally deposited and planarized using CMP or equivalent method as shown in FIG. 5J.

Narrow features are patterned over the planarized thin structural layer to form the narrow pressure equalization channels 523 (PEC) features, as shown in FIG. 5K. The PECs are created by etching through three material layers: the thin structural layer, the second sacrificial oxide layer and the thick structural layer. Perforations on the sense plate are then created through a short etch through thin structural layer at specific areas as shown in FIG. 5L. This etch also separates the structural connection between a microphone plate and a back plate allowing for electrical isolation between these two functional structures.

A final sacrificial layer 526 is deposited and planarized using CMP or equivalent method as shown in FIG. 5M. Shallow indents 528 are etched into the sacrificial layer to enable the formation of an electrically conductive standoff that is connected to the rest of the structure as shown in FIG. 5N. A standoff layer is formed through another structural material deposition layer 530 as shown in FIG. 5O. The height of the standoff is controlled by combined thickness of the structural 530 and sacrificial layer 526. A metal layer typically Germanium 531 is deposited and patterned on the standoff location that is defined through another structural layer etch, as shown in FIG. 5P. At this point the standoff 532 is formed as shown in FIG. 5Q, the stacked MEMS wafer process is completed and a MEMS substrate 550 is provided.

FIG. 5R illustrates the process on a second substrate or CMOS substrate 600. The second substrate 600 (or any metallized wafer) is first deposited with a protection layer 602. Such a protection layer acts as a barrier to prevent any vapor hydrofluoric acid (VHF) from attacking the dielectric in the CMOS substrate. The protection layer 602 and the passivation layer stack 601 are patterned and etched to expose a metal layer for bonding. The MEM substrate 550 is then bonded to the CMOS substrate 600 as shown in FIG. 5S. The bond may comprise a solder bond, a thermal compression bond, or a eutectic bond.

Through the bond, an electrical connection is then formed between the polysilicon on the MEMS substrate 550 and the metal on the CMOS substrate 600. In an embodiment, both the physical bond and the electrical connection are created using a eutectic solder bond using for example, an Aluminum-Germanium system where the germanium on the standoffs is in contact with exposed aluminum on the CMOS substrate 600. The substrates 550 and 600 are then bonded by heating them to a sufficient temperature to induce an aluminum-germanium eutectic reaction. Optionally, prior to bond the CMOS substrate 600 may be patterned with bumps on its surface to reduce contact and stiction to the MEMS substrate 550. Also optionally, prior or post bonding, a port may be formed through the CMOS substrate 600 to allow acoustic excitation to the MEMS substrate 550. The bonded CMOS substrate 600 coupled to MEMS substrate 550 is referred to as an integrated substrate 650 as shown in FIG. 5T.

FIG. 5U illustrates grinding and etching the silicon from the side of the MEMS substrate 550, stopping at the sacrificial oxide layer 510. The final step releases the movable MEMS plate 630 in the integrated substrate 650 by removing all the sacrificial oxide layers and blocks through an etchant such as an isotropic oxide etchant as shown in FIG. 5V. An example of such an etchant is hydrofluoric acid in vapor form. Optionally as shown in FIG. 5V', the integrated substrate 650' can also be formed to provide a closed back cavity structure 640.

In a device in accordance with an embodiment, the reduction of sensitivity due to electrical sensing area reduction is mitigated by incorporation of an additional sensing back plate in the MEMS acoustic sensor when the device is fully integrated including a MEMS back plate, MEMS membrane and metal on a CMOS substrate. The back plate behind the membrane forms an additional electrode for increasing the area of electrical transduction; the opposing forces created by the electrodes on both sides enable electrical feedback control, stiction control and structural self-testing of the microphone.

The back plate is typically rigid in comparison to the membrane. The back plate can be designed to reduce damping by accommodating perforations, slots and spacing without compromising the rigidity of the back plate.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A MEMS device comprising: a first plate with a first surface and a second surface; a second plate with a third surface and a fourth surface, attached to the first plate;
    a third plate with a fifth surface and a sixth surface embedded within one of the first plate or the second plate;
    a suspension connecting a first substrate to one of the first plate or the second plate;
    a linkage connecting the first plate and the second plate, where the first plate and second plate are displaced in the presence of an acoustic pressure differential between the first and second surfaces;
    wherein the first and second plate together comprise an acoustic plate and a perforated electrical plate coupled to the acoustic plate;
    wherein the first plate, the second plate, the third plate, the linkage and the suspension form a structure in the first substrate, wherein the structure is bonded to a second substrate;
    a first electrode formed on the third plate;
    a second electrode formed on the second substrate;
    a first gap formed between the second plate and the first electrode; and
    a second gap formed between the second plate and the second electrode.

2. The MEMS device of claim 1, wherein the displacement of the second plate causes the first and second gap to change inversely.

3. The MEMS device of claim 1, wherein the structure is contained in an enclosure formed by the first substrate and a second substrate.

4. The MEMS device of claim 1, wherein the second substrate or the third plate contain an acoustic port to expose the first surface to the environment.

5. The MEMS device of claim 1, where each of the first, second and third plates comprises of a material containing silicon.

6. The MEMS device of claim 1, wherein a differential scheme allows for two variable capacitances to be set between the second plate and the first electrode and between the second plate and the second electrode.

7. The MEMS device of claim 1, wherein a variable capacitance is formed between the first plate and the third plate.

8. The MEMS device of claim 1, wherein the second plate moves in the same direction as the first plate.

9. The MEMS device of claim 1, wherein the second plate is out of phase with the first plate.

10. The MEMS device of claim 1, where the MEMS device is an acoustic sensor.

11. The MEMS device of claim 1, where the enclosure forms an acoustic cavity.

12. The MEMS device of claim 1, where an acoustic cavity is formed by an external enclosure that encloses both first and second substrates.

13. The MEMS device of claim 1, further comprising a perforated plate covering at least a portion of the acoustic port.

14. The MEMS device of claim 1, wherein the second electrode comprises aluminum.

15. The MEMS device of claim 1, wherein the second electrode is connected to an integrated circuit on the second substrate.

16. The MEMS device of claim 1, wherein a second gap is defined by a standoff formed onto the structure.

17. The MEMS device of claim 1, wherein the first plate has a thickness greater than the third plate.

18. The MEMS device of claim 1, wherein a standoff formed on the structure is bonded to the second substrate.

19. The MEMS device of claim 18, wherein the bond is a eutectic bond.

20. The MEMS device of claim 1, wherein movement of the first plate and the second plate are limited by the third plate and the second substrate.

21. The MEMS device of claim 1, wherein the first gap is defined by difference between the total thickness of the first plate, and the sum of the third plate and the thickness of the thin membrane layer in the first plate.

22. The MEMS device of claim 1, wherein the first plate and the second plates comprise a frame layer, a thin membrane layer and a thicker connection layer, where frame layer has a thickness greater than the membrane layer.

23. The MEMS device of claim 22, wherein the frame layer and the membrane layer comprises of silicon.

24. An integrated microphone comprising:
    a microphone structure formed on a first substrate and bonded to a second substrate; and
    first and second electrodes; wherein the microphone structure is suspended between the first and second electrodes to provide a differential sensing scheme;

wherein one of the first electrode and second electrode is a deposited conductor on the second substrate and the other of the first electrode and second electrode is a conductive back plate; and wherein the conductive backplate is embedded within the microphone structure;

wherein the microphone structure further comprises are acoustic plate and a perforated electrical plate coupled to the acoustic plate;

wherein one of the first or second substrates contains an opening to expose the microphone structure to the environment.

25. The integrated microphone of claim 24, wherein the microphone structure is contained in an enclosure formed by the first substrate and a second substrate.

26. The integrated microphone of claim 24, wherein the first electrode and the second electrode are connected to an integrated circuit on the second substrate.

27. The integrated microphone of claim 24, wherein one of the first or second substrates contains an opening to expose the microphone structure to an external enclosure.

28. An acoustic sensing device comprising:

a structure with a first surface and a second surface attached to a first substrate;

wherein a first electrode is formed on the first substrate and a second electrode is formed by a conductive layer on a second substrate;

wherein the structure is suspended between first and second electrodes to provide a differential sensing scheme;

wherein the second electrode is embedded within the structure;

wherein the structure further comprises an acoustic plate and a perforated electrical plate coupled to the acoustic plate;

wherein the structure is displaced in the presence of an acoustic pressure differential between the first and second surfaces of the structure;

wherein the first substrate contains an opening.

29. The acoustic sensing device of claim 28, wherein the first electrode is connected to an integrated circuit on the second substrate through the bond between the structure and the second substrate.

30. The acoustic sensing device of claim 28, wherein second substrates contains an opening to expose the microphone structure to an external enclosure.

* * * * *